United States Patent [19]
Gulczynski

[11] Patent Number: 5,426,413
[45] Date of Patent: * Jun. 20, 1995

[54] HIGH SPEED INTEGRATING DIGITAL-TO-ANALOG CONVERTER

[76] Inventor: Zdzislaw Gulczynski, P.O., Box 441, Winchester, Mass. 01890

[ * ] Notice: The portion of the term of this patent subsequent to Mar. 20, 2010 has been disclaimed.

[21] Appl. No.: 441,391

[22] Filed: Feb. 24, 1989

[30] Foreign Application Priority Data

Mar. 3, 1986 [DE] Germany .................. 36 06 894.2

[51] Int. Cl.⁶ ............................................. H03K 13/02
[52] U.S. Cl. ..................................... 341/144; 341/150
[58] Field of Search ................... 341/126, 144–146, 341/150, 154

[56] References Cited

U.S. PATENT DOCUMENTS

| | | | |
|---|---|---|---|
| 3,646,545 | 2/1972 | Naydan et al. | 340/347 DA X |
| 3,823,396 | 7/1974 | Lode | 340/347 M X |
| 4,070,665 | 1/1978 | Glennon et al. | 340/347 SY |
| 4,544,911 | 10/1985 | Altman et al. | 340/347 DA |
| 4,636,773 | 1/1987 | Lewis et al. | 377/52 X |

Primary Examiner—Vit W. Miska

[57] ABSTRACT

A digital-to-analog converter, particularly for digital systems requiring a fast and accurate high resolution conversion of a digital input code into a corresponding analog output voltage. The converter comprises essentially an integrator and at least two counters.

The most and least significant bits of the input code are loaded separately into two reverse counters which are released thereafter, whereby the output voltage of the integrator is increasing linearly. The slope of the integrator is correspondingly decreased every time one of the counters reaches zero. The conversion is completed when the remaining counter reaches zero. The integrator provides then the analog output voltage which is stored, free from transient glitches and available at its output inherently having low output impedance.

14 Claims, 2 Drawing Sheets

HIGH SPEED INTEGRATING DIGITAL-TO-ANALOG CONVERTER

CROSS REFERENCE TO RELATED APPLICATIONS

This application is related to the applications entitled "High Speed Integrating Analog-to-Digital Converter" Ser. No. 020,783 and "Sample-and-Hold Amplifier with Current Source Charger" Ser. No. 020,781, filed on even date herewith, the contents of which are hereby incorporated by reference herein, and is also related to the applications entitled "Digital-to-Analog Converter" Ser. No. 858,701 filed on May 2, 1986, and "Flash Analog-to-Digital Converter with Integrating Input Stage" Ser. No. 946,693 filed on Dec. 24, 1986. All inventions are by the same inventor.

BACKGROUND AND SUMMARY OF THE INVENTION

The invention relates to an integrating digital-to-analog converter (DAC), particularly for digital systems requiring a fast and accurate high resolution conversion of a digital input code into a corresponding analog output voltage.

An overwhelming majority of the conventional DACs comprises an analog switch matrix controlled by the digital input code, and an associated resistive network for obtaining binary weighted partial currents. These currents are added in a summing unit and possibly amplified so that a voltage proportional to the input code is provided. Generally, DACs with a current or voltage output can be distinguished.

These DACs require a high number of components. The values of the resistors must be accurately matched and also have a possibly identical temperature coefficient. The parasitic capacitances as well as switching delays of the analog switches cause high transient voltage spikes. Output amplifiers are employed as DACs with current output and often low output impedance dependent on input code, are of little use. The new error sources such as offset voltage, overshoot tendency and high settling time must be taken into account.

A simple conversion method is a DAC with a reverse counter and an integrator. The circuit contains also a single switch. The input code is loaded into the counter. The counting starts when the switch is turned on so that the output voltage of the integrator ramps up from ground potential. The switch is turned off when the counter reaches zero, whereby the integrator stores the conversion result.

This circuit offers a very high accuracy, high noise rejection, extremely low nonlinearities and high monotonicity. The circuit is also very simple. However, the DAC is extraordinary slow and for that reason practically meaningless.

The invention is intended to provide a DAC with all the above mentioned advantages as well as a very high speed. A DAC according to the present invention includes means for separating the digital input code into a plurality of groups of adjacent bits with each group having a separate weight, a separate counting means for counting thru each separate group of bits, an integrator means for integrating an input signal at a determinable rate and providing an integrated output signal in response thereto, and means for determining the rate of integration in response to the counting and to the weight of the counting means.

BRIEF DESCRIPTION OF THE DRAWINGS

The present invention will become more clear in conjunction with the accompanying figures of which.

DETAILED DESCRIPTION OF THE INVENTION

Generally included are counters, current source and integrating means. More specifically, included are means for separating the digital input code into plurality of groups having separate weights. This simply includes means for loading different portions of the input code into the different counters. For simplicity, the input code is divided into two groups each having a weight and being loaded into a counter. The two reverse counters Z1 and Z2 count down to zero from the code value input in response to proper control signals.

The reference current source J provides different predetermined currents in response to counting of each counter and proportionate in value to the binary weights of the portions of the input code loaded in each counter. By this means different currents are output while one of the counters Z1 or Z2 is counting. When Z1 and Z2 are both counting a sum of the currents is output. The current of the current source is thus set for the duration of a counting, is reduced upon reaching zero by a counter and is terminated by the end of a conversion. The integration is then terminated and the voltage across the capacitor C represents the analog conversion of the digital input code.

The integrator means includes the operational amplifier (OA) A and the capacitor C, and is coupled to receive an input current for charging the capacitor. The integration rates are determined by the values of the input current and the capacitor, and are proportional to the binary weights of the numbers counted in the counter Z1 and Z2. The switch S is employed to zero the voltage across the capacitor C.

Figure 1:
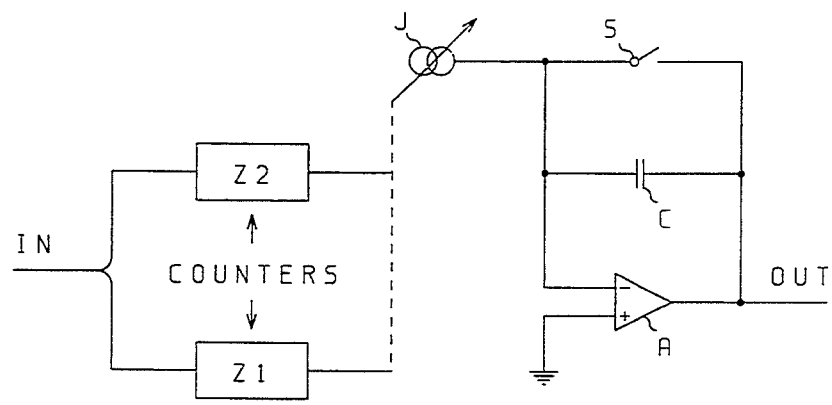
FIG. 1 is a first embodiment.

FIG. 1 is a basic structure of the embodiment. The capacitor C and the switch S are connected between an output and inverting input of the OA A. Its noninverting input is on ground potential. A controllable current source J is also coupled to the inverting input.

The input code is separated into a plurality of groups of adjacent bits with each group having a separate weight, for instance binary weight. For simplicity of the example, the most and least significant bits of the input code are loaded into the reverse counters respectively Z2 and Z1. The counters are released afterwards for counting pulses of an oscillator while the switch S is open. The output voltage of the OA A is increasing linearly.

The current source J provides a reference current to the integrator in response to a counting of each respective counter Z1 and Z2, and its binary weight. The amount of the current provided is the sum of the separate currents, each corresponding to the binary weight of the respective counter. The current source J can thus consist of separate current sources each responsive to a counter and each having a current output proportional to the binary weight of its respective counter supplied for duration proportional to the counting thereof.

The current of the current source J is correspondingly decreased when one of the counters reaches zero. The current is equal zero when the remaining counter reaches zero, whereby the conversion is completed. The conversion result is stored in the capacitor C and available at the output of the OA A. The capacitor is discharged before a start of a new conversion by a momentary closing the switch S.

A circuit with the OA A in a voltage follower configuration has the same mode of operation. The switch S and the capacitor C are connected between ground and the noninverting input of the OA A. The current source J is coupled to the noninverting input thereof.

Figure 2:
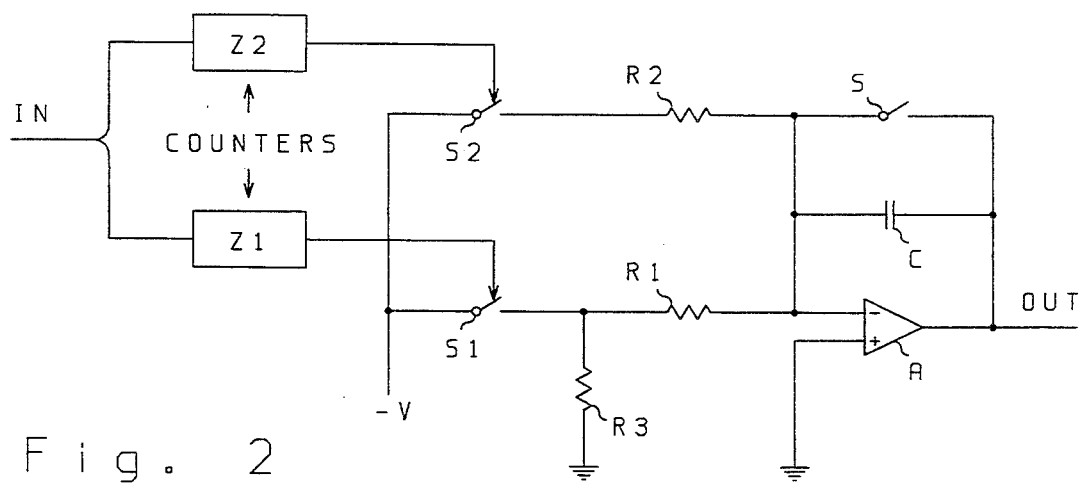
FIG. 2 is the preferred embodiment.

FIG. 2 is a DAC with the controllable current source embodied as a voltage source −V with the switches S1 and S2, and resistors R1 and R2. The resistor R3 is employed only to enforce an equal "on" current of the switches S1 and S2 as the value of the resistor R1 is higher than R2.

The input code is loaded into the counters Z2 and Z1. The counters are then released and the switches respectively S2 and S1 are closed, whereby the switch S is open. The output voltage of the OA A is increasing linearly. A switch is open when the respective counter reaches zero. The conversion is completed when the remaining switch is open.

A switch of the same type can be employed in a feedback path of an amplifier providing the reference voltage. For example, the temperature drift of the switches S1 and S2 can be then compensated.

The DAC of FIG. 1 can be expanded by a second similar circuit which contains at least one counter. Specifically, the noninverting input of the first OA is coupled to the output of the second OA rather than ground. Each counter decreases once the current of the respective current source while reaching zero. The special advantage of this configuration is a bigger choice of the individual component values which is essential in a high resolution DAC.

The slew rate of the OA A can be reduced by reducing the ratio of the current of the current source to the capacitor value. A capacitor-switch network including capacitors coupled in series can be used as the capacitor C. The capacitance value can be then changed which makes possible that the current source J provides a fixed current. The integrator of FIG. 3 comprises a pair of capacitors coupled in series and each bridged by a switch for determining the capacitor value and discharging the individual capacitors.

For the fixed current of the source J, the capacitor voltages have the weights predetermined by the values of the respective capacitors, and are proportional to the countings during which the respective switches S are open. For instance, if the most and least significant bits of the digital input code are equal 0011 and 0001 respectively, the switches coupled in parallel with the capacitors having relative values 1 and 16 will be open respectively three and one time units before terminating the current of the source J. The result is the same as using the current source J providing a determinable current for the duration of the respective countings for charging a single capacitor, and terminating the current by the end of the conversion, as in the embodiments of FIGS. 1 and 2.

The output voltage of the DAC should be equal zero with the switch S closed. This is of a special advantage for an automatic offset error correction. A comparator coupled thereto should oscillate, which is easy detectable.

A digital correction is employed for reducing remaining errors. At least one counter can have an associated ROM. The input code is then applied to the ROMs whereby each of the error correction values stored therein represents a number. The input code loaded into counters is then decremented or incremented by these numbers for obtaining a correct value of the analog output voltage. Furthermore, a digital adder can be employed for adding the error correction values to the input code. The result is then loaded into the counters.

Figure 3:
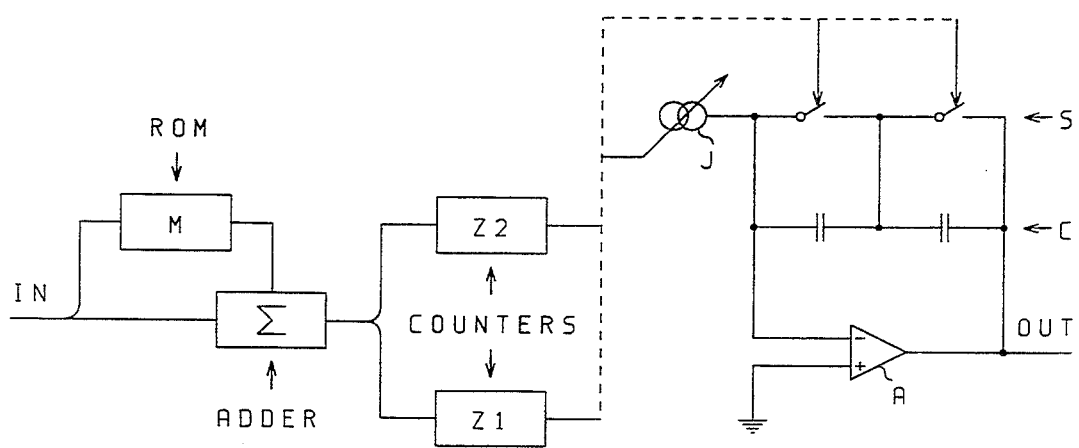
FIG. 3 is the embodiment of FIG. 1 with a digital error correction and a capacitor-switch network.
Throughout the drawings, similar references denote similar parts.

FIG. 3 is an embodiment based on FIG. 1 and with the digital correction. It includes the ROM M coupled to receive most significant bits of the input code and providing error correction values which are added to the input code by the Adder Σ. The result of the addition is then loaded into the counters Z1 and Z2.

The output voltage of the DAC is stored, free from transient glitches and available at its output inherently having low output impedance. An input code having a highest binary value results in a longest conversion time. However, the time can be almost halved thru an employment of a second DAC of the same type and being coupled in parallel. This DAC receives the input codes of a higher value and begins the conversion at a highest output voltage which is then decreased.

The embodiments of the present invention described herein are intended to be taken in an illustrative and not a limiting sense. Various modifications and changes may be made to these embodiments by persons skilled in the art without departing from the scope of the present invention as defined in the appended claims.

What I claim is:

1. Digital-to-analog converter for converting digital input code into output signal, comprising:
    a plurality of counting means each for counting from a value determined by a group of adjacent bits of the digital input code and terminating the counting when a predetermined value is reached, and each having a weight;
    a source means for providing a sum of currents each having a substantially constant value corresponding to the weight of a separate counting means concurrently counting and equal zero otherwise; and
    an integrator means for integrating the sum of the currents provided by the source means, and providing the output signal of the digital-to-analog converter.

2. Digital-to-analog converter of claim 1 wherein the integrator means includes:
    an operational amplifier having a noninverting input coupled to ground, an inverting input coupled to the source means, and an output; and
    a capacitive means coupled between the inverting input and output of the operational amplifier.

3. Digital-to-analog converter of claim 2 wherein the source means includes:
    a voltage source means for providing a voltage;
    a plurality of resistive means for obtaining separate currents; and
    a plurality of switch means for coupling separate resistive means between the voltage source means and inverting input of the operational amplifier during the counting of the respective counting means.

4. Digital-to-analog converter of claim 2 wherein the integrator means includes a switch means for shorting out the capacitive means prior to counting of any counting means.

5. Digital-to-analog converter of claim 1 wherein the source means includes a controllable current source providing a reference current corresponding to the sum of said currents.

6. Digital-to-analog converter of claim 1 wherein each current of the source means is substantially proportional to the weight of the respective counting means.

7. Digital-to-analog converter of claim 1 wherein at least one counting means includes a reverse counter and the counting thereof is terminated at zero.

8. Digital-to-analog converter of claim 1 further including:
 a memory means for providing a correction code in response to most significant bits of the digital input code; and
 an adder means for correcting the digital input code by adding the correction code thereto.

9. Digital-to-analog converter for converting digital input code into output signal, comprising:
 a plurality of counting means each for counting from a value determined by a group of adjacent bits of the digital input code and terminating the counting when a predetermined value is reached, and each having a weight;
 a source means for providing a current when at least one counting means is counting which current is substantially constant; and
 an integrator means for integrating the current and providing the output signal of the digital-to-analog converter, and including a capacitive means for conducting the current and providing an amount of capacitance in response to the weight of each counting means concurrently counting.

10. Digital-to-analog converter of claim 9 wherein the integrator means includes an operational amplifier having a noninverting input coupled to ground, an inverting input coupled to the source means, and an output; and
 further wherein the capacitive means is coupled between the inverting input and output of the operational amplifier.

11. Digital-to-analog converter of claim 9 wherein the capacitive means includes:
 a plurality of capacitors coupled in series; and
 a plurality of switch means shorting out separate capacitors prior to counting of the respective counting means.

12. Digital-to-analog converter of claim 11 wherein a value of each capacitor is substantially inversely proportional to the weight of the respective counting means.

13. Digital-to-analog converter of claim 9 wherein at least one counting means includes a reverse counter and the counting thereof is terminated at zero.

14. Digital-to-analog converter of claim 9 further including:
 a memory means for providing a correction code in response to most significant bits of the digital input code; and
 an adder means for correcting the digital input code by adding the correction code thereto.

* * * * *